United States Patent
Yeh et al.

(10) Patent No.: US 9,600,363 B2
(45) Date of Patent: Mar. 21, 2017

(54) DATA ACCESSING METHOD, MEMORY CONTROLLING CIRCUIT UNIT AND MEMORY STORAGE APPARATUS

(71) Applicant: PHISON ELECTRONICS CORP., Miaoli (TW)

(72) Inventors: Chih-Kang Yeh, Kinmen County (TW); Chang-Guang Lin, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 86 days.

(21) Appl. No.: 14/736,284

(22) Filed: Jun. 11, 2015

(65) Prior Publication Data
US 2016/0314040 A1    Oct. 27, 2016

(30) Foreign Application Priority Data
Apr. 24, 2015    (TW) .............................. 104113217 A

(51) Int. Cl.
G11B 20/18    (2006.01)
G06F 11/10    (2006.01)
(Continued)

(52) U.S. Cl.
CPC .......... G06F 11/1068 (2013.01); G06F 3/064 (2013.01); G06F 3/0619 (2013.01);
(Continued)

(58) Field of Classification Search
CPC ............. G06F 11/1044; G06F 12/0238; G06F 12/0246; G06F 3/0679; G06F 3/064;
(Continued)

(56) References Cited

U.S. PATENT DOCUMENTS 7,191,382 B2    3/2007    James et al.
8,621,321 B2 *   12/2013    Steiner .................. H03M 13/09
                                                            714/758
(Continued)

FOREIGN PATENT DOCUMENTS

TW    201133500    10/2011
WO    2015047847    4/2015

OTHER PUBLICATIONS

"Office Action of Taiwan Counterpart Application", issued on Feb. 19, 2016, p. 1-p. 12, in which the listed references were cited.

*Primary Examiner* — Phung M Chung
(74) *Attorney, Agent, or Firm* — Jianq Chyun IP Office

(57) ABSTRACT

A data accessing method for a memory storage apparatus is provided. The method includes using a first check code circuit to generate a first check code corresponding to a first data stream and generating a first data set based on the first data stream and the first check code. The method also includes using a second check code circuit to obtain the first data stream and the first check code from the first data set and check the first data stream according to the first check code. The method still includes using a third check code circuit to generate a second check code according to the checked first data stream and generating a data frame based on the checked first data stream and the second check code and thereby programming the data frame into a physical programming unit.

24 Claims, 8 Drawing Sheets

(51) Int. Cl.
    *G11C 29/52* (2006.01)
    *H03M 13/29* (2006.01)
    *G06F 3/06* (2006.01)

(52) U.S. Cl.
    CPC ............ *G06F 3/0679* (2013.01); *G11C 29/52* (2013.01); *H03M 13/2906* (2013.01)

(58) Field of Classification Search
    CPC ......... G11C 29/52; G11C 7/1006; G11C 7/22; H03M 13/2906
    See application file for complete search history.

(56) References Cited

U.S. PATENT DOCUMENTS

| | | | | |
|---|---|---|---|---|
| 8,713,407 B2* | 4/2014 | Rho | .................... | G06F 11/1068 714/768 |
| 2011/0161774 A1* | 6/2011 | Shin | .................... | G06F 11/1012 714/755 |
| 2013/0275832 A1 | 10/2013 | D'Abreu et al. | | |

* cited by examiner

DATA ACCESSING METHOD, MEMORY CONTROLLING CIRCUIT UNIT AND MEMORY STORAGE APPARATUS

CROSS-REFERENCE TO RELATED APPLICATION

This application claims the priority benefit of Taiwan application serial no. 104113217, filed on Apr. 24, 2015. The entirety of the above-mentioned patent application is hereby incorporated by reference herein and made a part of this specification.

BACKGROUND

1. Technical Field

The present invention relates to a data accessing method, and particularly relates to a data accessing method, a memory controlling circuit unit, and a memory storage apparatus for a rewritable non-volatile memory.

2. Description of Related Art

The markets of digital cameras, cellular phones, and MP3 players have expanded rapidly in recent years, resulting in escalated demand for storage media by consumers. Since the rewritable non-volatile memory module (e.g., flash memory) has the characteristics of data non-volatility, low power consumption, compact size, and no mechanical structure, the rewritable non-volatile memory module is suitable to be built in the aforesaid portable multimedia devices.

In general, data written to the rewritable non-volatile memory module are encoded according to an error checking and correcting code, and data read from the rewritable non-volatile memory module are also decoded through a corresponding procedure. However, an error of data bit may occur during the transmission from the host system receiving the data to writing the data to the rewritable non-volatile memory module (i.e., within the memory controlling circuit unit). Thus, how to ensure the accuracy of data within the memory controlling circuit unit is an issue that people skilled in the art should work on.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data accessing method, a memory controlling circuit unit, and a memory storage apparatus capable of effectively verifying the accuracy of data.

According to an exemplary embodiment of the present invention, a data accessing method for a memory storage apparatus is provided. The memory storage apparatus has a rewritable non-volatile memory module. In addition, the rewritable non-volatile memory module has a plurality of physical erasing units, and each of the physical erasing units has a plurality of physical programming units. The data accessing method includes receiving a first data stream, generating a first check code corresponding to the first data stream by using a first check code circuit, and generating a first data set according to the first data stream and the first check code corresponding to the first data stream. The data accessing method also includes obtaining the first data stream and the first check code corresponding to the first data stream from the first data set by using a second check code circuit, and checking the first data stream by using the first check code corresponding to the first data stream. The data accessing method further includes generating a second check code according to information corresponding to the checked first data stream by using a third check code circuit, generating an error checking and correcting code by using an error checking and correcting circuit, and generating a data frame according to the checked first data stream, the second check code, and the error checking and correcting code. Moreover, the data accessing method includes writing the data frame to a first physical programming unit among the physical programming units, wherein the first check code circuit is different from the third check code circuit.

An exemplary embodiment of the invention provides a memory controlling circuit unit for controlling a rewritable non-volatile memory module, including a host interface, a first check code circuit, a memory management circuit, a second check code circuit, a third check code circuit, a memory interface, and an error checking and correcting circuit. The first check code circuit is coupled to the host interface, the memory management circuit is coupled to the first check code circuit, the second check code circuit is coupled to the memory management circuit, the third check code circuit is coupled to the second check code circuit, and the memory interface is coupled to the third check code circuit and the rewritable non-volatile memory module. The error checking and correcting circuit is coupled to the memory management circuit. The rewritable non-volatile memory module has a plurality of physical erasing units, and each of the physical erasing units has a plurality of physical programming units. The host interface receives a first data stream, the first check code generating and checking circuit generates a first check code corresponding to the first data stream, and the memory management circuit generates a first data set according to the first data stream and the first check code corresponding to the first data stream. The second check code circuit retrieves the first data stream and the first check code corresponding to the first data stream from the first data set, and checks the first data stream according to the first check code corresponding to the first data stream. The third check code circuit generates a second check code according to information corresponding to the checked first data stream. The error checking and correcting circuit generates an error checking and correcting code. The memory management circuit generates a data frame according to the checked first data stream, the second check code, and the error checking and correcting code, the memory management circuit writes the data frame to a first physical programming unit of the physical programming units through the memory interface. In addition, the first check code circuit is different from the third check code circuit.

An exemplary embodiment of the invention provides a memory storage apparatus, including a connecting interface unit, a rewritable non-volatile memory module, and the memory controlling circuit unit. The connecting interface unit is coupled to a host system. The rewritable non-volatile memory module has a plurality of physical erasing units. The memory controlling circuit unit is coupled to the connecting interface unit and the rewritable non-volatile memory module.

Based on above, the memory controlling circuit unit, the memory storage apparatus, and the data accessing method thereof according to the exemplary embodiments of the invention are able to effective ensure the accuracy of data during transmission within the memory controlling circuit unit and simultaneously avoid an issue that a space in the redundant bit area is insufficient in storing a large number of check codes.

In order to make the aforementioned and other features and advantages of the invention comprehensible, several exemplary embodiments accompanied with figures are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
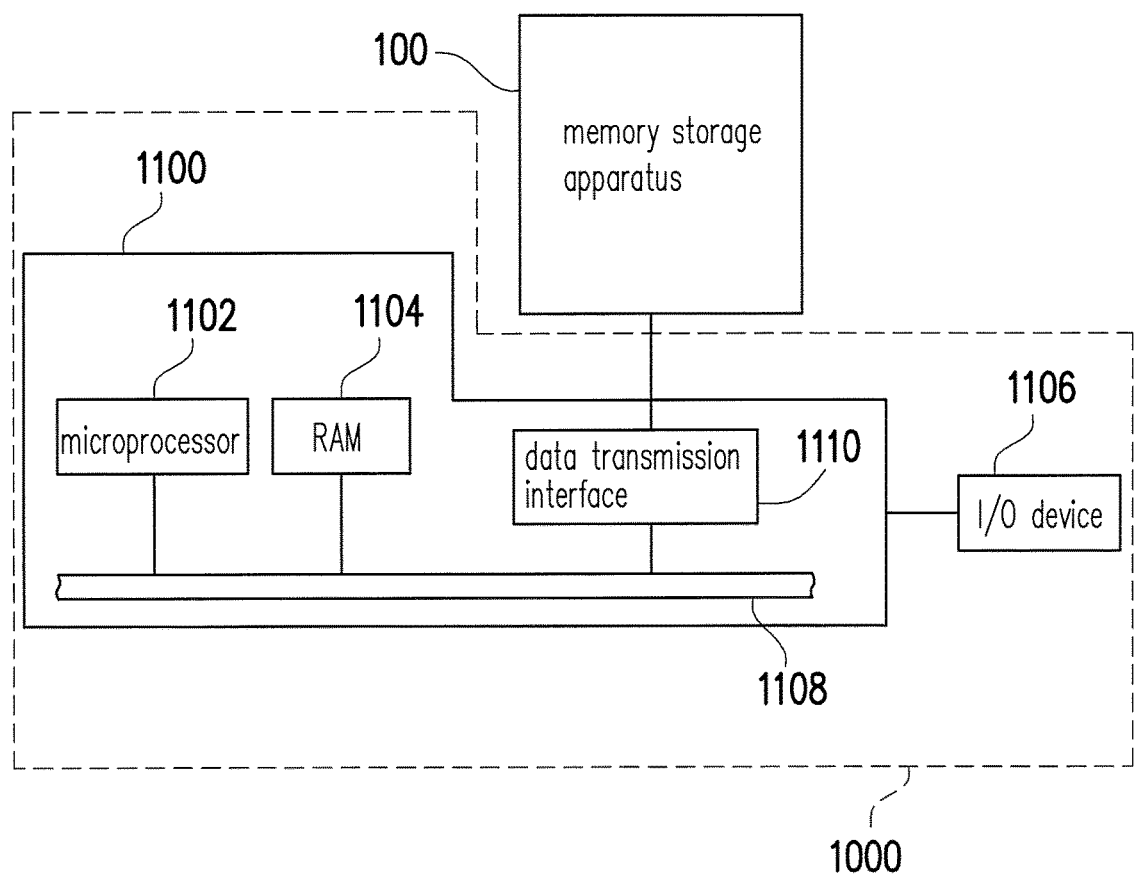
FIG. 1 is a view illustrating a host system and a memory storage apparatus according to an exemplary embodiment.

Reference will now be made in detail to the present embodiments of the invention, examples of which are illustrated in the accompanying drawings. Wherever possible, the same reference numbers are used in the drawings and the description to refer to the same or like parts.

Embodiments of the present invention may include any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1 is a view illustrating a host system and a memory storage apparatus according to an exemplary embodiment.

Figure 2:
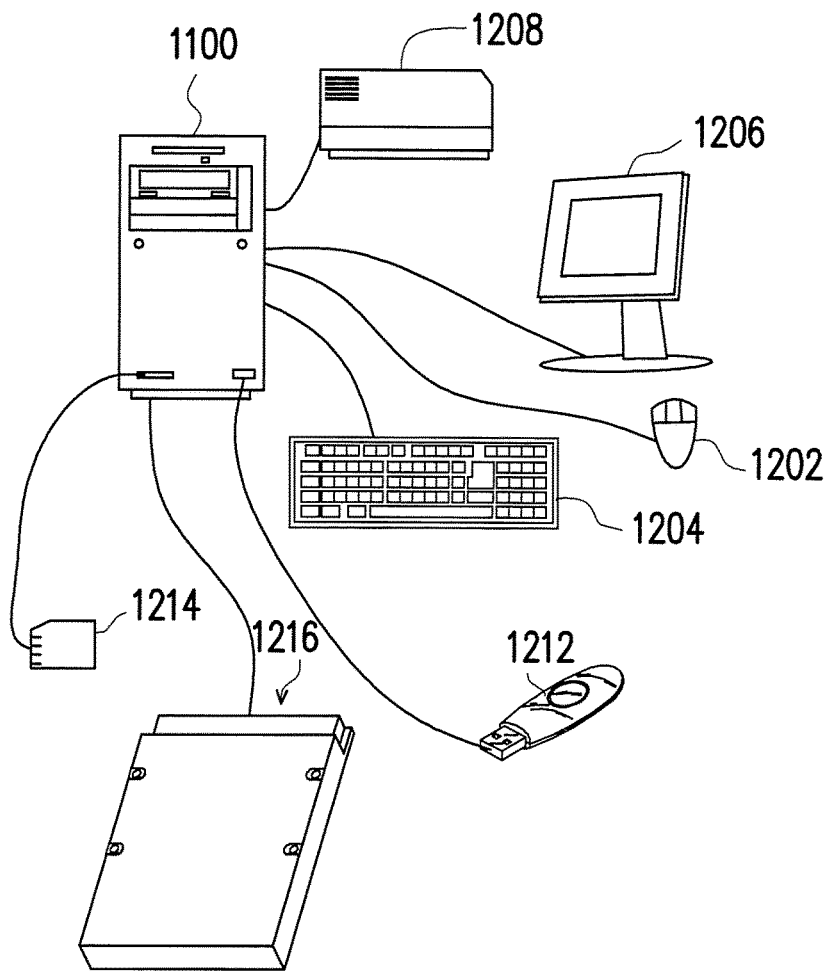
FIG. 2 is a schematic view illustrating a computer, an input/output apparatus, and a memory storage apparatus according to an exemplary embodiment.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 2. It should be understood that the devices illustrated in FIG. 2 do not serve to limit the I/O device 1106, and the I/O device 1106 may further include other devices.

According to an exemplary embodiment, the memory storage apparatus 100 is coupled to other elements of the host system 1000 through the data transmission interface 1110. Through operations of the microprocessor 1102, the random access memory 1104 and the I/O device 1106, the data may be written into or read from the memory storage apparatus 100. For instance, the memory storage apparatus 100 may be a rewritable non-volatile memory storage apparatus, such as a flash drive 1210, a memory card 1212, or a solid state drive (SSD) 1214, etc., as shown in FIG. 2.

Figure 3:
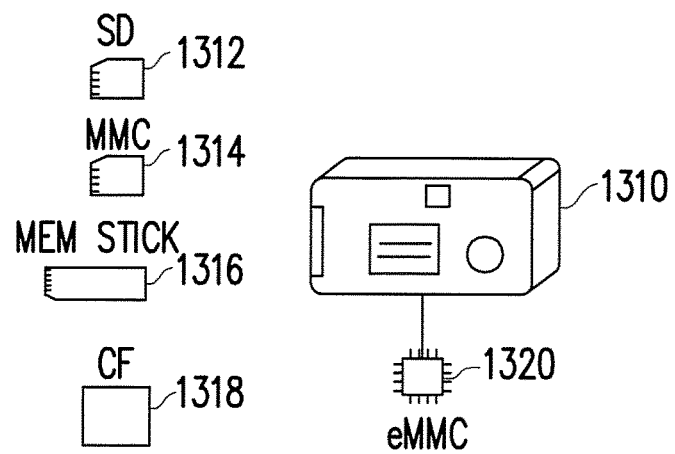
FIG. 3 is a schematic view illustrating a host system and a memory storage apparatus according to an exemplary embodiment.

Generally speaking, the host system 1000 may substantially be any system collocated with the memory storage apparatus 100 for storing data. Even though the host system 1000 is described as a computer system in this exemplary embodiment, in another exemplary embodiment of the invention, the host system 1000 may be a digital camera, a video camera, a telecommunication device, an audio player, or a video player, etc. For example, if the host system is a digital camera (video camera) 1310, the rewritable non-volatile memory storage apparatus is then a secure digital (SD) card 1312, a multi media card (MMC) 1314, a memory stick 1316, a compact flash (CF) card 1318 or an embedded storage apparatus 1320 (as shown in FIG. 3) used in the digital camera 1310. The embedded storage device 1320 includes an embedded MMC (eMMC). It should be mentioned that the eMMC is directly coupled to a substrate of the host system.

Figure 4:
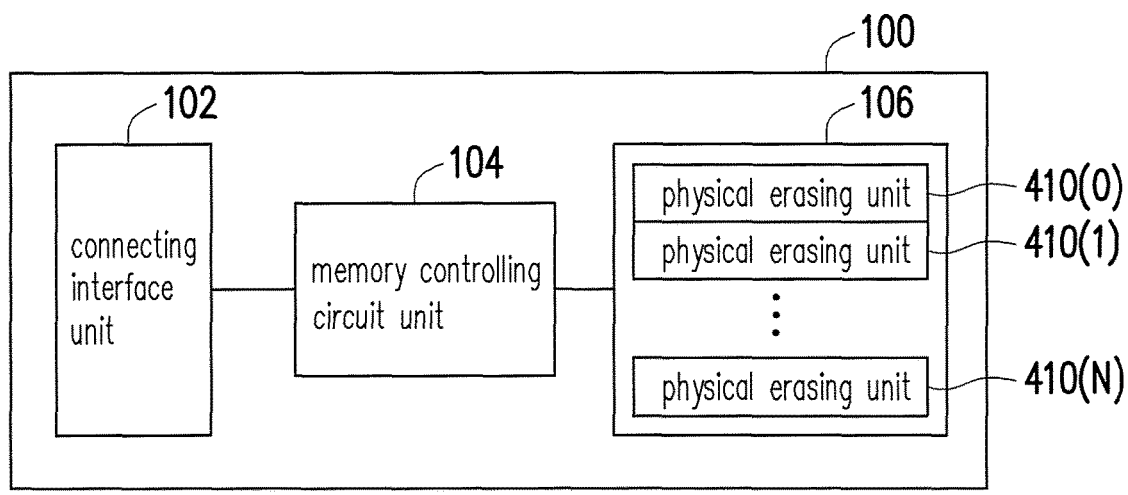
FIG. 4 is a schematic block view illustrating the memory storage apparatus according to an exemplary embodiment.

FIG. 4 is a schematic block view illustrating the memory storage apparatus according to an exemplary embodiment.

Referring to FIG. 4, the memory storage apparatus 100 includes a connecting interface unit 102, a memory controlling circuit unit 104, and the rewritable non-volatile memory module 106.

In this exemplary embodiment, the connecting interface unit 102 is compatible with the serial advanced technology attachment (SATA) standard. However, it should be understood that the present invention is not limited thereto. The connecting interface unit 102 may also be compatible with the parallel advanced technology attachment (PATA) standard, the Institute of Electrical and Electronic Engineers (IEEE) 1394 standard, the peripheral component interconnect express (PCI Express) standard, the universal serial bus (USB) standard, the ultra high speed-I (UHS-I) interface standard, the ultra high speed-II (UHS-II) interface standard, the secure digital (SD) interface standard, the memory stick (MS) interface standard, the multimedia card (MMC) interface standard, the compact flash (CF) interface standard, the integrated device electronics (IDE) standard, or other suitable standards. In this exemplary embodiment, the connecting interface unit may be packaged with the memory controlling circuit unit in a chip, or set outside a chip that includes the memory controlling circuit unit.

The memory controlling circuit unit 104 is configured to execute a plurality of logic gates or control commands implemented in a hardware form or a firmware form and executes operations such as data writing, data reading, and data erasing, etc., in the rewritable non-volatile memory module 106 according to a command of the host system 1000.

The rewritable non-volatile memory module 106 is coupled to the memory controlling circuit unit 104, and is configured to store data written by the host system 1000. The rewritable non-volatile memory module 106 has physical erasing units 410(0) to 410(N). For example, the physical erasing units 410(0) to 410(N) may belong to the same die or different dies. Each of the memory erasing units has a plurality of physical programming units. In addition, the physical programming units of the same physical erasing unit may be written independently and erased simultaneously. However, it should be understood that the present invention is not limited thereto. Each of the physical erasing units may be formed by 64 physical programming units, 256 physical programming units, or other arbitrary numbers of physical programming units.

More specifically, the physical erasing unit is the smallest unit for erasing. In other words, each of the physical erasing units contains the smallest number of memory cells to be erased together. The physical programming unit is the smallest unit for programming. Namely, the physical programming unit is the smallest unit for writing data. Each of the physical programming units generally includes a data bit area and a redundant bit area. The data bit area includes a plurality of physical accessing address to store the user's data, while the redundant bit area is configured to store system data (e.g., control information and error correcting code). In this exemplary embodiment, the data bit area of each of the physical programming units includes eight physical accessing addresses, and a size of each of the physical accessing addresses is 512 bytes. However, in other exemplary embodiments, the data bit area may include more or fewer physical accessing addresses, and the invention does not intend to limit the size and number of the physical accessing addresses. For example, in an exemplary embodiment, the physical erasing unit is a physical block, and the physical programming unit is a physical page or a physical sector. However, the present invention is not limited thereto.

In this exemplary embodiment, the rewritable non-volatile memory module 106 is a multi level cell (MLC) NAND flash memory module (namely, a flash memory module where each memory cell stores two data bits). However, the present invention is not limited thereto. The rewritable non-volatile memory module 106 may also be a single level cell (SLC) NAND flash memory module (i.e., a flash memory module where each memory cell stores one data bit), a trinary level cell (TLC) NAND flash memory module (i.e., a flash memory where each memory cell stores three data bits), other flash memory modules, or other memory modules having similar properties.

Figure 5:
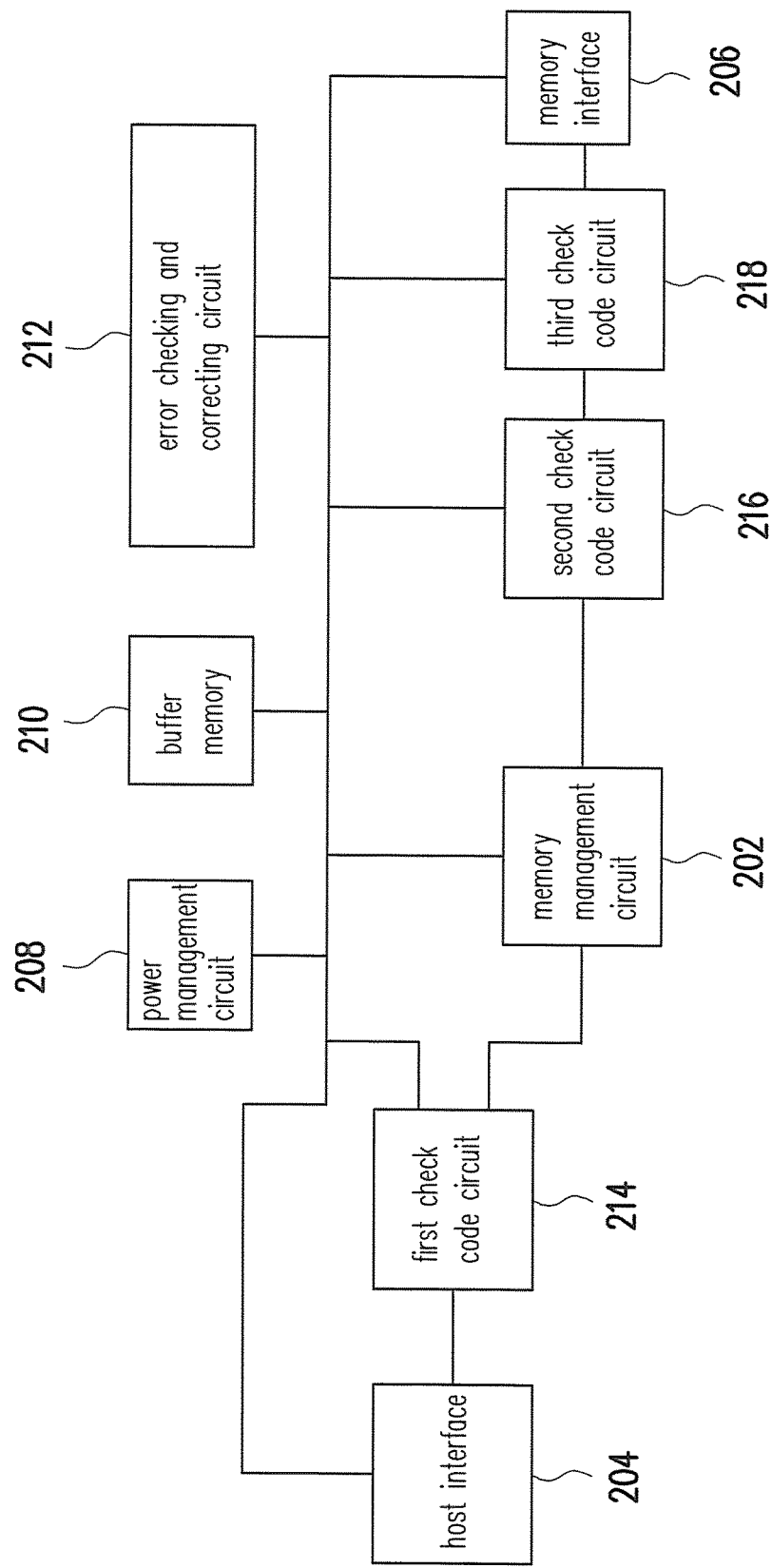
FIG. 5 is a schematic block view illustrating a memory controlling circuit unit according to an exemplary embodiment.

FIG. 5 is a schematic block view illustrating a memory controlling circuit unit according to an exemplary embodiment.

Referring to FIG. 5, the memory controlling circuit unit 104 includes a memory management circuit 202, a host interface 204, a memory interface 206, a power management circuit 208, a buffer memory 210, an error checking and correcting circuit 212, a first check code circuit 214, a second check code circuit 216, and a third check code circuit 218.

The memory management circuit 202 is configured to control an overall operation of the memory controlling circuit unit 104. Specifically, the memory management circuit 202 has a plurality of control commands. When the memory storage apparatus 100 operates, the control commands are executed to instruct the rewritable non-volatile memory module, so as to perform operations such as data writing, reading, and erasing, etc.

In this exemplary embodiment, the control commands of the memory management circuit 202 are implemented in a firmware form. For example, the memory management circuit 202 has a microprocessor (not shown) and a read-only memory (not shown), and the control commands are burnt into the read-only memory. When the memory storage apparatus 100 operates, the control commands are executed by the microprocessor for various data operations, such as data writing, data reading or data erasing.

Figure 6:
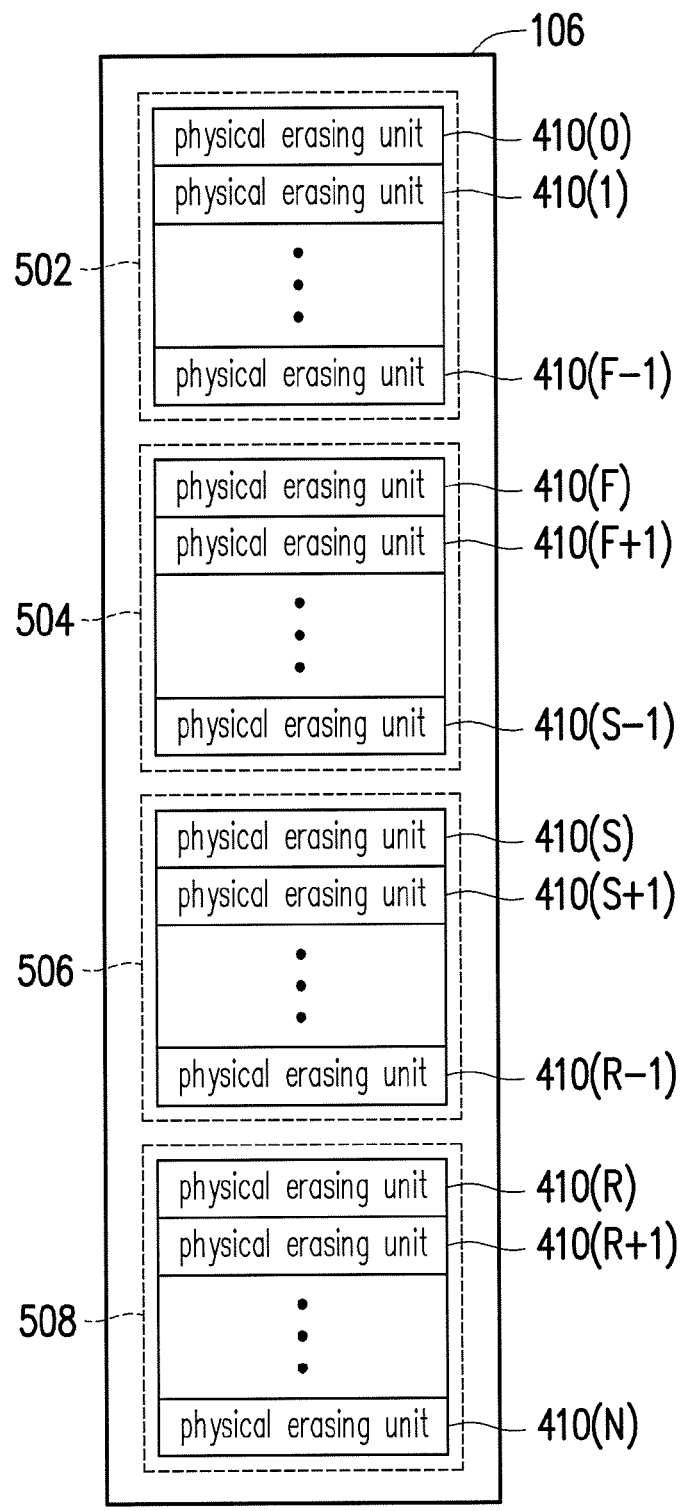
FIGS. 6 and 7 are exemplary schematic views illustrating management of physical blocks according to a first exemplary embodiment.
Figure 7:
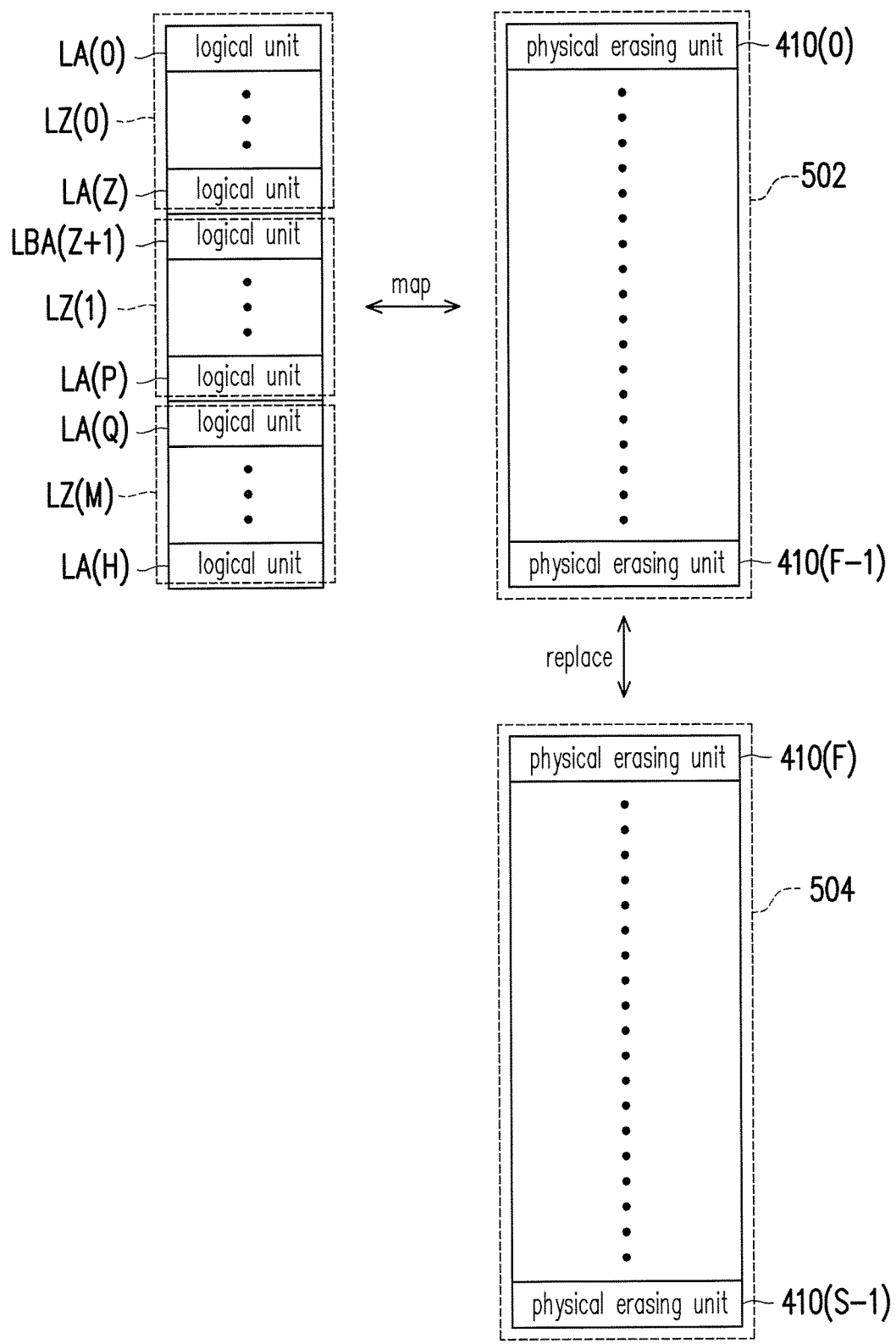

FIGS. 6 and 7 are exemplary schematic views illustrating management of the physical erasing units according to an exemplary embodiment.

Referring to FIG. 6, the memory controlling circuit unit 104 (or the memory management circuit 202) may logically group the physical erasing units 410(0) to 410(N) into a data area 502, a spare area 504, a system area 506, and a replacement area 508.

The physical erasing units logically belonging to the data area 502 and the spare area 504 are configured to store data from the host system 1000. Specifically, the physical erasing units in the data area 502 are considered as physical erasing units already storing data, while the physical erasing units in the spare area 504 are configured to replace the physical erasing units in the data area 502. In other words, when the host system 1000 receives a write command and data to be written, the memory management circuit 202 may retrieve the physical erasing units from the spare area 502, and write the data to the retrieved physical erasing units, so as to replace the physical erasing units in the data area 502.

The physical erasing units logically belonging to the system area 506 are configured to record the system data. For example, the system data include the manufacturer and the model number of the rewritable non-volatile memory module, the number of physical erasing units in the rewritable non-volatile memory module, and the number of physical programming units of each of the physical erasing units, etc.

The physical erasing units logically belonging to the replacement area 508 are configured to replace damaged physical erasing units in a damaged physical erasing unit replacement procedure. Specifically, if the replacement area 508 still has a normal physical erasing unit and a physical erasing unit in the data area 502 is damaged, the memory management circuit 202 may get the normal physical erasing unit to replace the damaged physical erasing unit.

In particular, the numbers of physical erasing units in the data area 502, the spare area 504, the system area 506, and the replacement area 508 may differ as the memory specifications differ. Also, it should be understood that, in the operation of the memory storage apparatus 100, a grouping relation of the physical erasing units to the data area 502, the spare area 504, the system area 506, and the replacement area 508 may change dynamically. For example, when a physical erasing unit in the spare area 504 is damaged and replaced by a physical erasing unit in the replacement area 508, the physical erasing unit originally grouped the replacement area 508 is then associated to the spare area 504.

Referring to FIG. 7, the memory controlling circuit unit 104 (or the memory management circuit 202) may configure logical units LA(0) to LA(H) to map the physical erasing units in the data area 502. In addition, each of the logical units has a plurality of logical sub-units to map the physical programming units of the corresponding physical erasing unit. Moreover, when the host system 100 intends to write data to the logical units or update data stored in the logical units, the memory controlling circuit unit 104 (or the memory management circuit 202) may retrieve a physical erasing unit from the spare area 504 to write the data, so as to replace the physical erasing unit in the data area 502. In this exemplary embodiment, the logical sub-unit may be a logical page or a logical sector.

To identify which physical erasing unit stores data of which logical unit, in this exemplary embodiment, the memory controlling circuit 104 (or the memory management circuit 202) may record a mapping relation between the logical units and the physical erasing units. Moreover, when the host system 1000 intends to access data in the logical sub-units, the memory controlling circuit unit 104 (or the memory management circuit 202) may identify the logical unit that the logical sub-unit belongs to, and access the data in the physical erasing unit mapping the logical unit. For example, in this exemplary embodiment, the memory controlling circuit unit 104 (or the memory management circuit 202) may store a logical-to-physical address mapping table to record the physical erasing unit that each of the logical units maps and load the logical-to-physical mapping table to the buffer memory 208 for maintenance when the memory controlling circuit unit 104 (or the memory management circuit 202) intends to access the data.

It should be mentioned that since a capacity of the buffer memory 208 is limited and unable to store the mapping table recording the mapping relation of all the logical units, in this embodiment, the memory controlling unit 104 (or the memory management circuit 202) may group the logical units LA(0) to LA(H) into a plurality of logical areas LZ(0) to LZ(M) and arrange a logical-to-physical address mapping table for each of the logical areas. In particular, when the memory controlling unit 104 (or the memory management circuit 202) intends to update the mapping relation of one of the logical units, the logical-to-physical address mapping table corresponding to the logical area that the logical unit belongs to may be loaded to the buffer memory 208 for updating.

Accordingly, in this exemplary embodiment, the rewritable non-volatile memory module 106 of the memory storage apparatus 100 is managed based on page. Thus, when the write command is executed, the memory controlling circuit unit 104 (or the memory management circuit 202) may write the data into one physical programming unit after another (also referred to as random writing mechanism) regardless of which logical sub-unit of which logical unit the current data is written to. Specifically, the memory controlling circuit unit 104 (or the memory management circuit 202) may get an empty physical erasing unit from the spare area 504 as the physical erasing unit currently in use (also referred to as operating physical erasing unit) to write the data. Also, when the physical erasing unit currently in use is already full, the memory controlling circuit unit 104 (or the memory management circuit 202) may get another empty physical erasing unit from the spare area 504 as the physical erasing unit currently in use, so as to continue writing the data corresponding to the write command of the host system 1000. In particular, to avoid the physical erasing units in the spare area 504 from exhausting, when the memory controlling circuit unit 104 (or the memory management circuit 202) intends to get a physical erasing unit from the spare area 504 and the number of physical erasing units in the spare area 504 already drops to a predetermined recycling threshold value, the memory controlling circuit unit 104 (or the memory management circuit 202) may perform a data merging procedure, so as to make data in at least one physical erasing unit in the data area 502 invalid, and associate the physical erasing unit storing data that are all invalid data in the data area 502 with the spare area 504, so that the number of physical erasing units in the spare area 504 becomes greater than the predetermined recycling threshold value. For example, when performing the data merging procedure, the memory controlling circuit unit 104 (or the memory management circuit 202) requires at least one empty physical erasing unit. Thus, the recycling threshold value is set as a value at least greater than 1.

In another exemplary embodiment, a control command of the memory management circuit 202 may also be stored in a specific area of the rewritable non-volatile memory module 106 (e.g., the system area designated to store the system data in the memory module) in a form of programming codes. Besides, the memory management circuit 202 has a microprocessor (not shown), a read-only memory (not shown), and a random access memory (not shown). More specifically, the read-only memory has a boot code. In addition, when the memory controlling circuit unit 104 is enabled, the microprocessor may execute the boot code to load the control command stored in the rewritable non-volatile memory module 106 to the random access memory of the memory management circuit 202. Afterwards, the microprocessor unit executes the control commands for various data operation such as data writing, data reading and data erasing.

In addition, in another exemplary embodiment, the control command of the memory management circuit 202 may also be implemented in a hardware form. For example, the memory management circuit 202 includes a micro-controller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the micro-controller. Moreover, the memory cell management circuit is configured to manage the physical erasing units of the rewritable non-volatile memory module 106. The memory write circuit is configured to send a write command to the rewritable non-volatile memory module 106, so as to write data to the rewritable non-volatile memory module 106. The memory read circuit is configured to send a read command to the rewritable non-volatile memory module 106, so as to read data from the rewritable non-volatile memory module 106. The memory erase circuit is configured to send an erase command to the rewritable non-volatile memory module 106, so as to erase data from the rewritable non-volatile memory module 106. The data processing circuit is configured to process data to be written to the rewritable non-volatile memory module 106 and data to be read from the rewritable non-volatile memory module 106.

Referring to FIG. 5 again, the host interface 204 is coupled to the memory management circuit 202 and configured to receive and identify the command and data sent by the host system 1000. In other words, the command and data sent by the host system 1000 may be sent to the memory management circuit 202 through the host interface 204. In this exemplary embodiment, the host interface 204 is compatible with the SATA standard. However, it should be understood that the present invention is not limited thereto. The host interface 204 may also be compatible with the PATA standard, the IEEE 1394 standard, the PCI Express standard, the USB standard, the UHS-I standard, the UHS-II standard, the SD standard, the MS standard, the MMS standard, the CF standard, the IDE standard, or other suitable data transmission standards.

The memory interface 206 is coupled to the memory management circuit 202 and configured to access the rewritable non-volatile memory module 106. In other words, data to be written into the rewritable non-volatile memory module 106 are converted into a format acceptable to the rewritable non-volatile memory module 106 by the memory interface 206.

The power management circuit 208 is coupled to the memory management circuit 202 and configured to control the power of the of the memory storage apparatus 100.

The buffer memory 210 is coupled to the memory management circuit 202 and configured to temporarily store data and commands from the host system 1000 or data from the rewritable non-volatile memory module 106.

The error checking and correcting circuit 212 is coupled to the memory management circuit 202 and configured to execute an error checking and correcting procedure to ensure the accuracy of data. Specifically, when the memory management circuit 202 receives the write command from the host system 1000, the error checking and correcting circuit 212 may generate a corresponding error checking and correcting (ECC) code in correspondence with data corresponding to the write command. Also, the memory management circuit 202 may write the data corresponding to the write command and the corresponding error checking and correcting code to the rewritable non-volatile memory module 106. Afterwards, when reading the data from the rewritable non-volatile memory module 106, the memory management circuit 202 may simultaneously read the error checking and correcting code corresponding to the data. Besides, the error checking and correcting circuit 212 may execute the error checking and correcting procedure to the read data according to the error checking and correcting code.

The first check code circuit 214 and the second check code circuit 216 are configured to ensure the accuracy of data transmitted within the memory controlling circuit unit 104. In this embodiment, the first check code circuit 214 and the second check code circuit 216 are identical circuits, and are configured to be proximate to the host interface 204 or the memory interface 206 in the memory controlling circuit 104. Specifically, after the memory management circuit 202 receives data from the host system 1000 through the host interface 204, the first check code 214 may generate a corresponding check code according to the data. Then, before the memory management circuit 202 transmits the data to the rewritable non-volatile memory module 106 through the memory interface 206, the second check code circuit 216 may check the data according to the check code corresponding to the data, so as to ensure the accuracy of the data. For example, the first check code circuit 214 and the second check code circuit 216 are circuits implemented by adopting the cycle redundancy check (CRC) technology. In another exemplary embodiment, the second check code circuit 216 may also be configured in the rewritable non-volatile memory module 106.

The third check code circuit 218 is coupled to the second check code circuit 216. In this exemplary embodiment, the third check code circuit 218 is configured to re-generate a new check code for the data checked by the second check code circuit 216 and transmit the checked data and the new check code to the rewritable non-volatile memory module 106 for a programming operation (i.e., write operation). For example, the third check code circuit 218 is implemented by adopting the cycle redundancy check technology.

In an exemplary embodiment, checking abilities of the first check code circuit 214 and the second check code circuit 216 are different from a checking ability of the third check code circuit 218. Specifically, the first check code circuit 214 and the second check code circuit 216 generate the corresponding check code with a first predetermined data length as a unit, while the third check code circuit 218 generate the corresponding check code with a second predetermined data length as a unit. For example, in an exemplary embodiment, the first predetermined data length is 512 bytes, and the check code generated by the first check code circuit 214 and the second check code circuit 216 is two bytes, while the second predetermined data length is four kilobytes, and a length of the check code generated by the third check code circuit 216 is two bytes.

In particular, in an exemplary embodiment, the third check code circuit 218 may further adopt the address of the physical programming unit to be written as a parameter for generating the check code. Accordingly, whether received data are read from the correct address is able to be verified when the data is being read.

Figure 8:
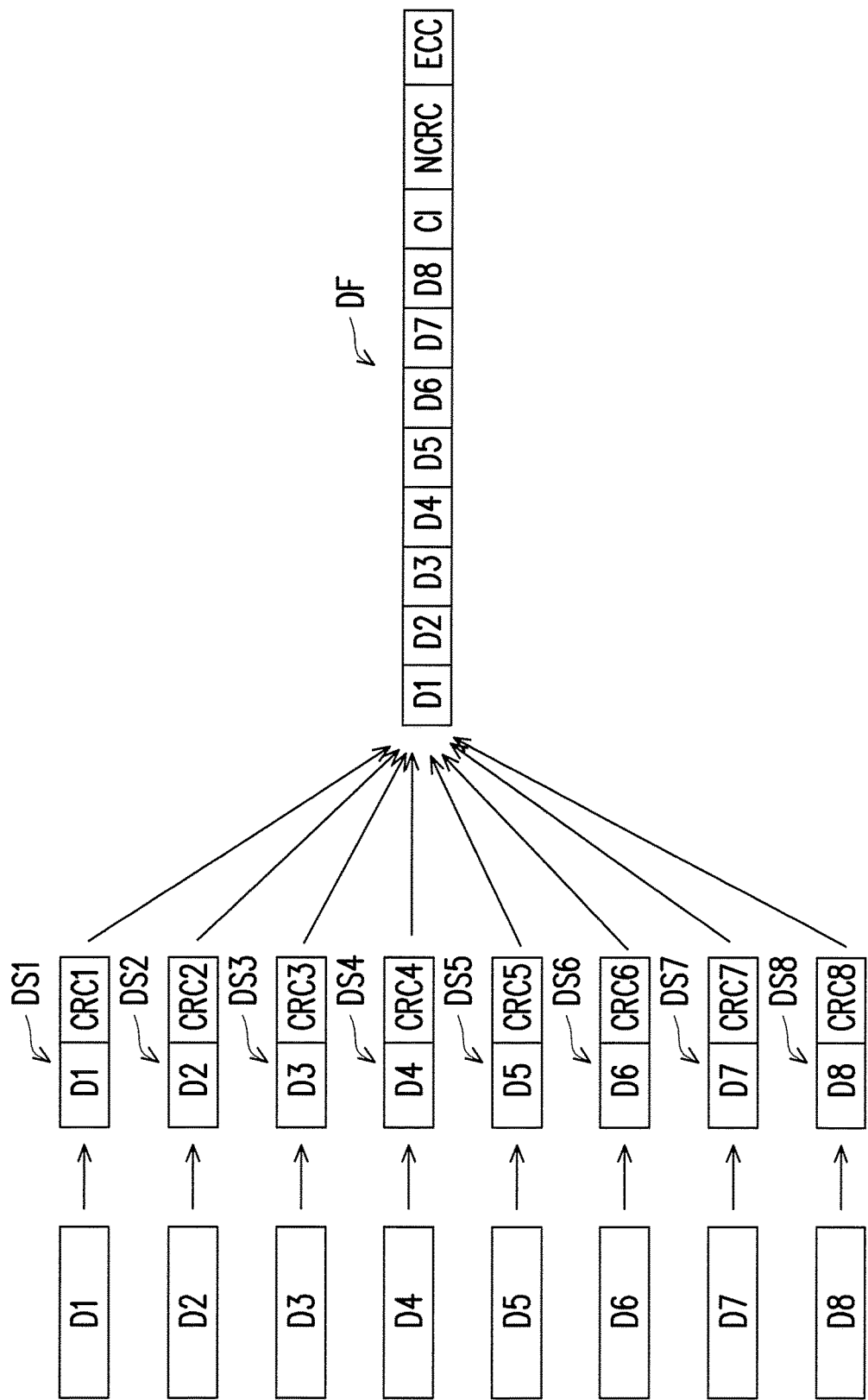
FIG. 8 is an exemplary schematic view illustrating a data flow when a write operation is executed according to an exemplary embodiment.

FIG. 8 is an exemplary schematic view illustrating a data flow when a write operation is executed according to an exemplary embodiment.

Referring to FIG. 8, it is assumed herein that the host system 1000 intends to save a data with 4 kilobytes to the memory storage apparatus 100, and the host system 1000 sends the data with 512 bytes as a unit. When the memory controlling circuit unit 104 (or the host interface 204) receives the write command and a first data (also referred to as data stream D1) with a data length of 512 bytes, the first check code circuit 214 may generate a corresponding check code CRC1 according to the data stream D1. Then, the memory management circuit 202 may process a data set DS1 including the data stream D1 and the check code CRC1, and temporarily store the data set DS1 in the buffer memory 210.

Then, when the memory controlling circuit unit 104 (or the host interface 204) receives a second data (also referred to as data stream D2) with a data length of 512 bytes from the host system 1000, the first check code circuit 214 may generate a corresponding check code CRC2 according to the data stream D2. Then, the memory management circuit 202 may process a data set DS2 including the data stream D2 and the check code CRC2 and temporarily store the data set DS2 in the buffer memory 210.

Then, when the memory controlling circuit 104 (or the host interface 204) receives a third data (also referred to as data stream D3) with a data length of 512 bytes from the host system 1000, the first check code circuit 214 may generate a corresponding check code CRC3 according to the data stream D3. Then, the memory management circuit 202 may process a data set DS3 including the data stream D3 and the check code CRC3 and temporarily store the data set DS3 in the buffer memory 210.

Then, when the memory controlling circuit 104 (or the host interface 204) receives a fourth data (also referred to as data stream D4) with a data length of 512 bytes from the host system 1000, the first check code circuit 214 may generate a corresponding check code CRC4 according to the data stream D4. Then, the memory management circuit 202 may process a data set DS4 including the data stream D4 and the check code CRC4 and temporarily store the data set DS4 in the buffer memory 210.

Then, when the memory controlling circuit 104 (or the host interface 204) receives a fifth data (also referred to as data stream D5) with a data length of 512 bytes from the host system 1000, the first check code circuit 214 may generate a corresponding check code CRC5 according to the data stream D5. Then, the memory management circuit 202 may process a data set DS5 including the data stream D5 and the check code CRC5 and temporarily store the data set DS5 in the buffer memory 210.

Then, when the memory controlling circuit unit 104 (or the host interface 204) receives a sixth data (also referred to as data stream D6) with a data length of 512 bytes from the host system 1000, the first check code circuit 214 may generate a corresponding check code CRC6 according to the data stream D6. Then, the memory management circuit 202 may process a data set DS6 including the data stream D6 and the check code CRC6 and temporarily store the data set DS6 in the buffer memory 210.

Then, when the memory controlling circuit unit 104 (or the host interface 204) receives a seventh data (also referred to as data stream D7) with a data length of 512 bytes from the host system 1000, the first check code circuit 214 may generate a corresponding check code CRC7 according to the data stream D7. Then, the memory management circuit 202 may process a data set DS7 including the data stream D7 and the check code CRC7 and temporarily store the data set DS7 in the buffer memory 210.

Then, when the memory controlling circuit unit 104 (or the host interface 204) receives an eighth data (also referred to as data stream D8) with a data length of 512 bytes from the host system 1000, the first check code circuit 214 may generate a corresponding check code CRC8 according to the data stream D8. Then, the memory management circuit 202 may process a data set DS8 including the data stream D8 and the check code CRC8 and temporarily store the data set DS8 in the buffer memory 210.

In an exemplary embodiment, after receiving all the data corresponding to the write command, the memory controlling circuit unit 104 (or the memory management circuit 202) may send a confirmation message to the host system 1000 to inform that the next command may be transmitted. However, the present invention is not limited thereto. In another exemplary embodiment, the memory controlling circuit 104 (or the memory management circuit 202) may also send the confirmation message to the host system 1000 after executing the received write command and already programming the data to the rewritable non-volatile memory module 106.

Then, when the memory controlling circuit unit 104 (or the memory management circuit 202) intends to execute the write command that is received to program the received data streams D1 to D8 to the rewritable non-volatile memory module 106, the memory controlling circuit 104 (or the memory management circuit 202) may choose an empty physical programming unit (also referred to as first physical programming unit) in the operating physical erasing unit to write the data streams D1 to D8 and generate a corresponding control information CI (e.g., information such as the corresponding logical address, etc.).

In particular, the data sets DS1 to DS8 temporarily stored in the buffer memory 210 may be sent to the second check code circuit 216, and the second check code circuit 216 may check the corresponding data stream according to the check code in each of the data sets, so as to ensure that there is no error bit in the data stream of the data set. Specifically, the second check code 216 may check the data stream D1 according to the check code CRC1, so as to ensure that there is no error that occurs in the data stream D1 during transmission. Similarly, the second check code circuit 216 may check the data streams D2 to D8 according to the check codes CRC2 to CRC8.

More specifically, before the checked data streams D1 to D8 are written to the first physical programming unit, the error checking and correcting circuit 212 may generate an error checking and correcting code ECC for the checked data streams D1 to D8, and the third check code circuit 218 may generate a corresponding check code NCRC for the checked data streams D1 to D8. According to the above, the third check code circuit 218 generates the check code with the second predetermined length as a unit (e.g., 4 kilobytes). Thus, the third check code circuit 218 generates a corresponding check code according to the checked data streams D1 to D8. For example, in an exemplary embodiment, the third check code circuit 218 may generate the check code NCRC according to the address information of the first physical programming unit where the checked data streams D1 to D8 are to be stored and/or contents of the checked data streams D1 to D8.

Lastly, the memory controlling circuit 104 (or the memory management circuit 202) may program a data frame DF including the checked data streams D1 to D8, the control information CI, the check code NCRC, and the error checking and correcting code ECC to the first physical programming unit. Specifically, the checked data streams D1 to D8 may be programmed to the data bit area of the first physical programming unit, and the control information CI, the check code NCRC, and the error checking and correcting code ECC may be programmed to the redundant bit area.

For example, when the host system 1000 sends the read command to read the data stored in the first physical programming unit, the memory controlling circuit unit 104 (or the memory management circuit 202) may read the data frame DF from the first physical programming unit. The error checking and correcting circuit 212 may execute an error correcting procedure to the data streams D1 to D8, so as to correct error bits in the data streams D1 to D8. Then, the corrected data streams D1 to D8 and the check code NCRC may be sent to the third check code circuit 216. The third check code circuit 216 may check the data streams D1 and D8 according to the check code NCRC. For example, as above, the check code NCRC may be generated according to the address information of the first physical programming unit. Thus, through checking, whether the received data are the data stored in the first physical programming unit may be checked. Then, the second check code circuit 214 may respectively generate the check codes CRC1 to CRC8 for the checked data streams D1 to D8. Then, the memory controlling circuit 104 (or the memory management circuit 202) may temporarily store the data sets DS1 to DS8 respectively including the data streams D1 to D8 and the check codes CRC1 to CRC8 to the buffer memory 210, and sequentially transmit the data streams D1 to D8 one after another to the host system 1000 in response to the read command. In particular, before transmitting the data through the host interface 204, the data streams D1 to D8 may be transmitted to the first check code circuit 214, and the first check code circuit 214 may check the data streams D1 to D8 by using the corresponding check codes, so as to ensure the accuracy of data transmitted to the host system 1000. For example, before transmitting the data stream D1 to the host system 1000, the first checking circuit 214 may check the data stream D1 according to the check code CRC1 in the data set DS1, and the checked data stream D1 may be transmitted to the host system 1000 through the host interface 204. Similarly, before transmitting the data streams DS2 to DS8, the first check code circuit 214 may check the data streams D2 to D8 according to the check codes CRC2 to CRC8 in the data sets DS2 to DS8.

It should be understood that, even though the error checking and correcting circuit 212 in this exemplary embodiment executes the error correcting procedure before data checking, the present invention is not limited thereto. In another exemplary embodiment, the error checking and correcting circuit 212 may execute the error correcting procedure after data checking.

Accordingly, whether an error occurs in the data stream when the data stream is transmitted within the memory controlling circuit unit 104 may be checked according to the check code generated by the first check code circuit 214. However, in an example where the check code (i.e., the check code generated by the first checking circuit 214) is generated according to the data transmission unit (e.g., 512 bytes) of the host system 100, when the data is programmed by taking the size (e.g., 4 kilobytes) of the physical programming unit as a unit, the large number of check codes may take up a significant space in the redundant bit area, making the redundant bit area insufficient in storing the control information or the error checking and correcting code. In this exemplary embodiment, before the data streams are transmitted to the rewritable non-volatile memory module, the second check code circuit 216, which is the same as the first check code circuit 214, may check the data streams according to the corresponding check codes. Then, the third check code circuit 218 may generate a check code for the checked data streams, as shown in the example of FIG. 8. Accordingly, the accuracy of data is ensured while the space of the redundant bit area remains sufficient.

It should be mentioned that, in another exemplary embodiment, the memory controlling circuit 104 may further include a data compressing circuit that allows the data bit area to store more data streams from the host system 1000 and saves more space in the redundant bit area. Specifically, the data compressing circuit may compress the data stream (e.g., the first data stream) checked by the second check code circuit 216 into a compressed data (e.g., first compressed data) and then transmit the compressed data to the third check code circuit 218. Taking FIG. 8 as an example, each physical programming unit is able to store eight data streams, and the check code with a total length of 16 bytes corresponding to the eight data streams may be replaced with a check code with a data length of two bytes, and the saved space is 14 bytes. If a data stream with a data length of 512 bytes is compressed into a data stream with a data length of 128 bytes, each physical programming unit is able to store 16 data streams, and the check code with a total length of 32 bytes corresponding to the 16 data streams may be replaced by a check code with a data length of two bytes, and the saved space is 30 bytes.

Figure 9:
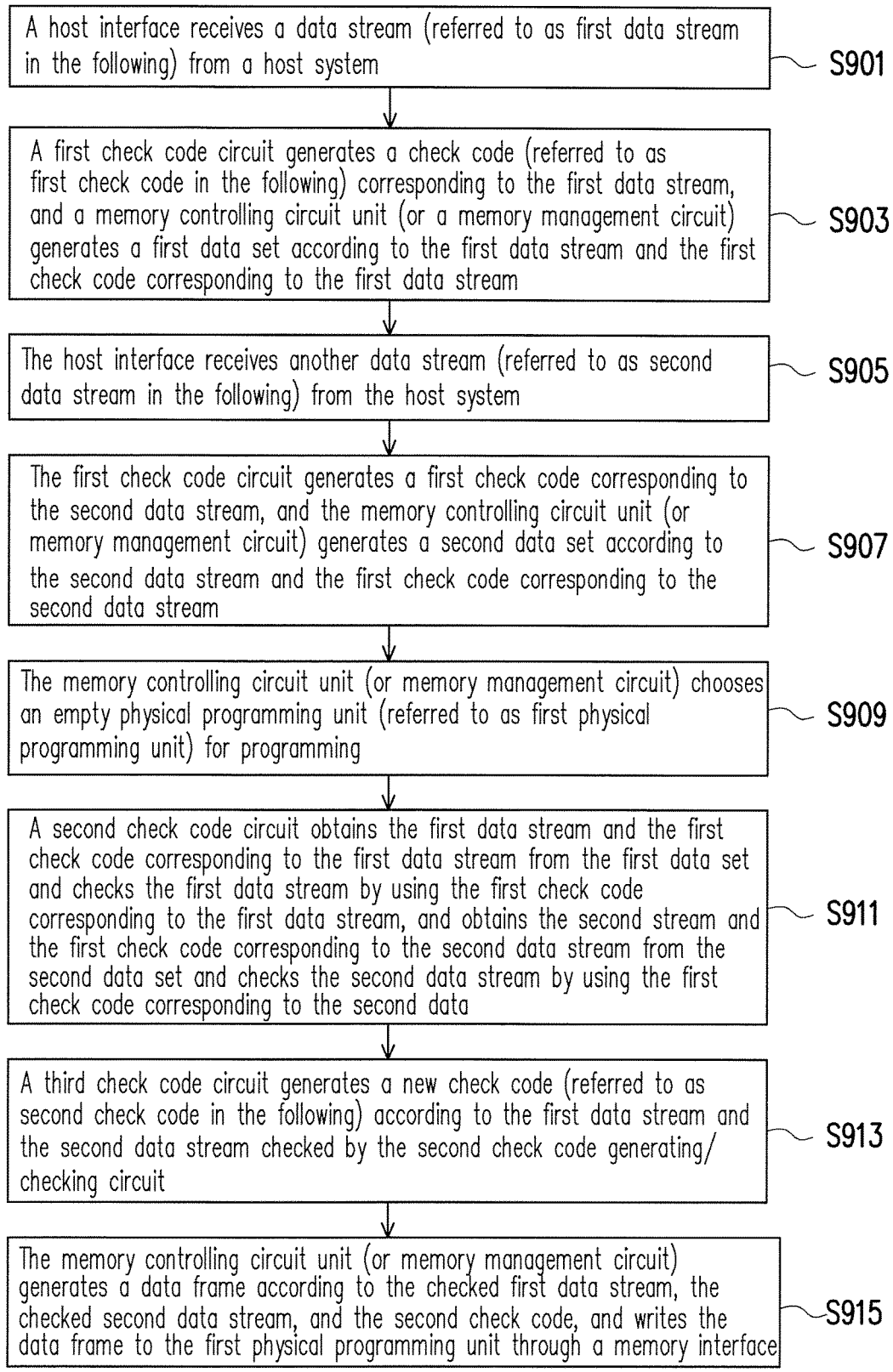
FIG. 9 is a flow chart illustrating a data accessing method according to an exemplary embodiment.

FIG. 9 is a flow chart illustrating a data accessing method according to an exemplary embodiment.

Referring to FIG. 9, at Step S901, the host interface 204 receives a data stream (referred to as first data stream in the following) from the host system 1000. At Step S903, the first check code circuit 214 generates a check code (referred to as first check code in the following) corresponding to the first data stream, and the memory controlling circuit unit 104 (or the memory management circuit 202) may generate a first data set according to the first data stream and the first check code corresponding to the first data stream.

At Step 905, the host interface 204 receives another data stream (referred to as second data stream in the following) from the host system 1000. At Step 907, the first check code circuit 214 may generate the first check code corresponding to the second data stream, and the memory controlling circuit unit 104 (or the memory management circuit 202) may generate a second data set according to the second data stream and the first check code corresponding to the second data stream.

At Step 909, the memory controlling circuit unit 104 (or the memory management circuit 202) chooses an empty physical programming unit (referred to as first physical programming unit) for programming.

At Step S911, the second check code circuit 216 obtains the first data stream and the first check code corresponding to the first data stream from the first data set, and checks the first data stream by using the first check code corresponding to the first data stream. In addition, the second check code circuit 216 obtains the second data stream and the first check code corresponding to the second data stream from the second data set, and checks the second data stream by using the first check code corresponding to the second data stream.

Then, at Step S913, the third check code circuit 218 may generate a new check code (referred to as second check code in the following) according to the first data stream and the second data stream checked by the second check code circuit 216. For example, in an exemplary embodiment, the third check code generating and checking circuit 218 may generate the second check code according to the first data stream, the second data stream, and the address information of the first physical programming unit. Thus, when reading the data, whether the read data are the data stored in the first physical programming unit may be checked according to a result of checking. Moreover, the checking capability of the third check code circuit 218 is different from the checking capabilities of the first check code circuit 214 and the second check code circuit 216. Thus, the size of the first check code corresponding to the first data stream and the size of the first check code corresponding to the second data stream are smaller than the size of the second check code. In another exemplary embodiment, the lengths of the first check codes corresponding to the first data stream and the second stream are not less than the length of the second check code.

At Step S915, the memory controlling circuit unit 104 (or the memory management circuit 202) may generate a data frame according to the checked first data stream and second data stream and the second check code, and the data frame is written to the first physical programming unit through the memory interface 206.

It should be noted that the exemplary method of FIG. 9 is described by taking the example that the host system 100 receives two data streams and then writes the two data streams into the physical programming unit together. However, the present invention is not limited thereto. For example, in another exemplary embodiment, the memory controlling circuit 104 may execute the programming operation when only one data stream is received. For example, Step 903 may be emitted. The second check code circuit 216 merely checks the first data stream, the third check code circuit 218 generates a new check code according to the first data stream, and the memory controlling circuit unit 104 (or the memory management circuit 202) generates the data stream according to the checked first data stream and the second check code, and the data frame is written to the first physical programming unit through the memory interface 206. Besides, in another exemplary embodiment, the memory controlling circuit unit 104 may also execute the programming operation after receiving more data streams.

In view of the foregoing, the data accessing method, the memory controlling circuit unit, and the memory storage apparatus provided in the invention are capable of effectively ensuring the accuracy of data during transmission within the memory controlling circuit unit while avoiding the issue that the space in the redundant bit area is insufficient and unable to store the large number of check codes. In addition, the data accessing method, the memory controlling circuit unit, and the memory storage apparatus provided in the invention may generate the check code again according to the address of programming. Thus, the reading error may be effectively avoided during the read operation. The previously described exemplary embodiments of the present invention have the advantages aforementioned, wherein the advantages aforementioned not required in all versions of the invention.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A data accessing method for a memory storage apparatus, wherein the memory storage apparatus has a rewritable non-volatile memory module, the rewritable non-volatile memory module has a plurality of physical erasing units, and each of the physical erasing units has a plurality of physical programming units, the data accessing method comprising:

receiving a first data stream, generating a first check code corresponding to the first data stream by using a first check code circuit, and generating a first data set according to the first data stream and the first check code corresponding to the first data stream;

obtaining the first data stream and the first check code corresponding to the first data stream from the first data set by using a second check code circuit and checking the first data stream by using the first check code corresponding to the first data stream;

generating a second check code according to information corresponding to the checked first data stream by using a third check code circuit;

generating an error checking and correcting code by using an error checking and correcting circuit;

generating a data frame according to the checked first data stream, the second check code, and the error checking and correcting code; and writing the data frame to a first physical programming unit of the physical programming units, wherein the first check code circuit is different from the third check code circuit.

2. The data accessing method as claimed in claim 1, wherein a length of the first check code is not less than a length of the second check code.

3. The data accessing method as claimed in claim 1, further comprising:

receiving a second data stream, generating a first check code corresponding to the second data stream by using the first check code circuit, and generating a second data set according to the second data stream and the first check code corresponding to the second data stream;

obtaining the second data stream and the first check code corresponding to the second data stream from the second data set by using the second check code circuit and checking the second data stream by using the first check code corresponding to the second data stream, wherein the step of generating the second check code according to the information corresponding to the checked first data stream by using the third check code circuit comprises: generating the second check code according to the checked first data stream and the checked second data stream by using the third check code circuit, wherein the step of generating the error checking and correcting code by using the error checking and correcting circuit comprises: generating the error checking and correcting code according to the checked first data stream and the checked second data stream by using the error checking and correcting circuit, wherein the step of generating the data frame according to the checked first data stream, the second check code, and the error checking and correcting code comprises: generating the data frame according to the checked first data stream, the checked second data stream, the second check code, and the error checking and correcting code.

4. The data accessing method as claimed in claim 3, wherein a total of a size of the first check code corresponding to the first data stream and a size of the first check code corresponding to the second data stream is greater than a size of the second check code.

5. The data accessing method as claimed in claim 1, wherein the step of generating the second check code according to the information corresponding to the checked first data stream by using the third check code circuit comprises:

generating the second check code according to address information of the first physical programming unit by using the third check code circuit.

6. The data accessing method as claimed in claim 1, further comprising:

compressing the checked first data stream to generate a first compressed data stream, wherein the step of generating the second check code according to the information corresponding to the checked first data stream by using the third check code circuit comprises:

generating the second check code according to the first compressed data stream corresponding to the checked first data stream by using the third check code circuit, wherein the step of generating the error checking and correcting code by using the error checking and correcting circuit comprises:

generating the error checking and correcting code according to the first compressed data stream corresponding to the checked first data stream by using the error checking and correcting circuit, wherein the step of generating the data frame according to the checked first data stream, the second check code, and the error checking and correcting code comprises:

generating the data frame according to the first compressed data stream corresponding to the checked first data stream, the second check code, and the error checking and correcting code.

7. The data accessing method as claimed in claim 1, further comprising:

compressing the checked first data stream to generate a first compressed data stream, wherein the step of generating the second check code according to the information corresponding to the checked first data stream by using the third check code circuit comprises:

generating the second check code according to the first compressed data stream corresponding to the checked first data stream and address information of the first physical programming unit by using the third check code circuit, wherein the step of generating the error checking and correcting code by using the error checking and correcting circuit comprises:

generating the error checking and correcting code according to the first compressed data stream corresponding to the checked first data stream by using the error checking and correcting circuit, wherein the step of generating the data frame according to the checked first data stream, the second check code, and the error checking and correcting code comprises:

generating the data frame according to the first compressed data stream corresponding to the checked first data stream, the second check code, and the error checking and correcting code.

8. The data accessing method as claimed in claim 1, further comprising:

reading the data frame from the first physical programming unit; and checking the first data stream in the read data frame according to the second check code in the read data frame by using the third check code circuit.

9. A memory controlling circuit unit, controlling a rewritable non-volatile memory module, the memory controlling circuit unit comprising:

a host interface;

a first check code circuit coupled to the host interface;

a memory management circuit coupled to the first check code circuit;

an error checking and correcting circuit coupled to the memory management circuit;

a second check code circuit coupled to the memory management circuit;

a third check code circuit coupled to the second check code circuit; and a memory interface coupled to the third check code circuit and configured to couple to the rewritable non-volatile memory module, wherein the rewritable non-volatile memory module has a plurality of physical erasing units, and each of the physical erasing units has a plurality of physical programming units, wherein the host interface receives a first data stream, and the first check code circuit generates a first check code corresponding to the first data stream, wherein the memory management circuit generates a first data set according to the first data stream and the first check code corresponding to the first data stream, wherein the second check code circuit obtains the first data stream and the first check code corresponding to the first data stream from the first data set, and checks the first data stream according to the first check code corresponding to the first data stream, wherein the third check code circuit generates a second check code according to information corresponding to the checked first data stream, wherein the error checking and correcting circuit generates an error checking and correcting code, wherein the memory management circuit generates a data frame according to the checked first data stream, the second check code, and the error checking and correcting code, wherein the memory management circuit writes the data frame to a first physical programming unit of the physical programming units through the memory interface.

wherein the first check code circuit is different from the third check code circuit.

10. The memory controlling circuit unit as claimed in claim 9, wherein a length of the first check code is not less than a length of the second check code.

11. The memory controlling circuit unit as claimed in claim 9, wherein the host interface receives a second data stream, wherein the first check code circuit generates a first check code corresponding to the second data stream, wherein the memory management circuit generates a second data set according to the second data stream and the first check code corresponding to the second data stream, wherein the second check code circuit obtains the second data stream and the first check code corresponding to the second data stream from the second data set, and checks the second data stream by using the first check code corresponding to the second data stream, wherein in the operation of generating the error checking and correcting code, the error checking and correcting circuit generates the error checking and correcting code according to the checked first data stream and the checked second data stream, and wherein in the operation of generating the data frame according to the checked first data stream, the second check code, and the error checking and correcting code, the memory management circuit generates the data frame according to the checked first data stream, the checked second data stream, the second check code, and the error checking and correcting code.

12. The memory controlling circuit unit as claimed in claim 11, wherein a total of a size of the first check code corresponding to the first data stream and a size of the first check code corresponding to the second data stream is greater than a size of the second check code.

13. The memory controlling circuit unit as claimed in claim 9, wherein in the operation of generating the second check code according to the information corresponding to the checked first data stream, the third check code circuit generates the second check code according to address information of the first physical programming unit.

14. The memory controlling circuit unit as claimed in claim 9, further comprising:

a data compressing circuit coupled to the memory management circuit and configured to compress the checked first data stream to generate a first compressed data stream, wherein in the operation of generating the second check code according to the information corresponding to the checked first data stream, the third check code circuit generates the second check code according to the first compressed data stream corresponding to the checked first data stream, wherein in the operation of generating the error checking and correcting code, the error checking and correcting circuit generates the error checking and correcting code according to the first compressed data stream corresponding to the checked first data stream, wherein in the operation of generating the data frame according to the checked first data stream, the second check code, and the error checking and correcting code, the memory management circuit generates the data frame according to the first compressed data stream corresponding to the checked first data stream, the second check code, and the error checking and correcting code.

15. The memory controlling circuit unit as claimed in claim 9, further comprising:
a data compressing circuit, coupled to the memory management circuit and configured to compress the checked first data stream to generate a first compressed data stream,
wherein in the operation of generating the second check code according to the information corresponding to the checked first data stream, the third check code circuit generates the second check code according to the first compressed data stream corresponding to the checked first data stream and address information of the first physical programming unit,
wherein in the operation of generating the error checking and correcting code, the error checking and correcting circuit generates the error checking and correcting code according to the first compressed data stream corresponding to the checked first data stream,
wherein in the operation of generating the data frame according to the checked first data stream, the second check code, and the error checking and correcting code, the memory management circuit generates the data frame according to the first compressed data stream corresponding to the checked first data stream, the second check code, and the error checking and correcting code.

16. The memory controlling circuit unit as claimed in claim 9,
wherein the memory management circuit reads the data frame from the first physical programming unit, and the third check code circuit checks the first data in the read data frame according to the second check code in the read data frame.

17. A memory storage apparatus, comprising:
a connecting interface unit, coupled to a host system;
a rewritable non-volatile memory module, wherein the rewritable non-volatile memory module has a plurality of physical erasing units, and each of the physical erasing units has a plurality of physical programming units; and
a memory controlling circuit unit, comprising a host interface, a memory interface, a first check code circuit, a second check code circuit, a third check code circuit, a memory management circuit, and an error checking and correcting circuit,
wherein the host interface is coupled to the connecting interface unit, the first check code circuit is coupled to the host interface, the memory management circuit is coupled to the first check code circuit, the second check code circuit is coupled to the memory management circuit, the third check code circuit is coupled to the second check code circuit, the memory interface is coupled to the third check code circuit and the rewritable non-volatile memory module, and the error checking and correcting circuit is coupled to the memory management circuit,
wherein the host interface receives a first data stream from the host system, and the first check code circuit generates a first check code corresponding to the first data stream,
wherein the memory management circuit generates a first data set according to the first data stream and the first check code corresponding to the first data stream,
wherein the second check code circuit obtains the first data stream and the first check code corresponding to the first data stream from the first data set, and checks the first data stream according to the first check code corresponding to the first data stream,
wherein the third check code circuit generates a second check code according to information corresponding to the checked first data stream,
wherein the error checking and correcting circuit generates an error checking and correcting code,
wherein the memory management circuit generates a data frame according to the checked first data stream, the second check code, and the error checking and correcting code,
wherein the memory management circuit writes the data frame to a first physical programming unit of the physical programming units through the memory interface,
wherein the first check code circuit is identical to the second check code circuit.

18. The memory storage apparatus as claimed in claim 17, wherein a length of the first check code is not less than a length of the second check code.

19. The memory storage apparatus as claimed in claim 17,
wherein the host interface receives a second data stream,
wherein the first check code circuit generates a first check code corresponding to the second data stream,
wherein the memory management circuit generates a second data set according to the second data stream and the first check code corresponding to the second data stream,
wherein the second check code circuit obtains the second data stream and the first check code corresponding to the second data stream from the second data set, and checks the second data stream by using the first check code corresponding to the second data stream,
wherein in the operation of generating the error checking and correcting code, the error checking and correcting circuit generates the error checking and correcting code according to the checked first data stream and the checked second data stream, and
wherein in the operation of generating the data frame according to the checked first data stream, the second check code, and the error checking and correcting code, the memory management circuit generates the data frame according to the checked first data stream, the checked second data stream, the second check code, and the error checking and correcting code.

20. The memory storage apparatus as claimed in claim 19, wherein a total of a size of the first check code corresponding to the first data stream and a size of the first check code corresponding to the second data stream is greater than a size of the second check code.

21. The memory storage apparatus as claimed in claim 17,
wherein in the operation of generating the second check code according to the information corresponding to the checked first data stream, the third check code circuit generates the second check code according to address information of the first physical programming unit.

22. The memory storage apparatus as claimed in claim 17, wherein the memory controlling circuit unit further comprises a data compressing circuit, and the data compressing circuit is coupled to the memory management circuit and configured to compress the checked first data stream to generate a first compressed data stream, wherein in the operation of generating the second check code according to the information corresponding to the checked first data stream, the third check code circuit generates the second check code according to the first compressed data stream corresponding to the checked first data stream, wherein in the operation of generating the error checking and correcting code, the error checking and correcting circuit generates the error checking and correcting code according to the first compressed data stream corresponding to the checked first data stream, wherein in the operation of generating the data frame according to the checked first data stream, the second check code, and the error checking and correcting code, the memory management circuit generates the data frame according to the first compressed data stream corresponding to the checked first data stream, the second check code, and the error checking and correcting code.

23. The memory storage apparatus as claimed in claim 17, wherein the memory controlling circuit unit further comprises a data compressing circuit, and the data compressing circuit is coupled to the memory management circuit and configured to compress the checked first data stream to generate a first compressed data stream, wherein in the operation of generating the second check code according to the information corresponding to the checked first data stream, the third check code circuit generates the second check code according to the first compressed data stream corresponding to the checked first data stream and address information of the first physical programming unit, wherein in the operation of generating the error checking and correcting code, the error checking and correcting circuit generates the error checking and correcting code according to the first compressed data stream corresponding to the checked first data stream, wherein in the operation of generating the data frame according to the checked first data stream, the second check code, and the error checking and correcting code, the memory management circuit generates the data frame according to the first compressed data stream corresponding to the checked first data stream, the second check code, and the error checking and correcting code.

24. The memory storage apparatus as claimed in claim 17, wherein the memory management circuit reads the data frame from the first physical programming unit, and the third check code circuit checks the first data stream in the read data frame according to the second check code in the read data frame.

* * * * *